(12) United States Patent
Yokoyama et al.

(10) Patent No.: US 11,148,398 B2
(45) Date of Patent: Oct. 19, 2021

(54) MULTILAYER COMPOSITE INCLUDING METALLIC GLASS AND POLYMER WITH REDUCED FATIGUE

(71) Applicant: Apple Inc., Cupertino, CA (US)

(72) Inventors: Yoshihiko Yokoyama, Tokyo (JP); Naoto Matsuyuki, Tokyo (JP); Sungwon Bae, Pleasanton, CA (US); Theodore A. Waniuk, Lake Forest, CA (US)

(73) Assignee: Apple Inc., Cupertino, CA (US)

( * ) Notice: Subject to any disclaimer, the term of this patent is extended or adjusted under 35 U.S.C. 154(b) by 19 days.

(21) Appl. No.: 16/133,495

(22) Filed: Sep. 17, 2018

(65) Prior Publication Data

US 2019/0085465 A1 Mar. 21, 2019

Related U.S. Application Data

(60) Provisional application No. 62/559,273, filed on Sep. 15, 2017.

(51) Int. Cl.
| | | |
|---|---|---|
| B32B 17/10 | (2006.01) | |
| C23C 28/02 | (2006.01) | |
| C23C 14/14 | (2006.01) | |
| B05D 7/14 | (2006.01) | |
| C23C 14/34 | (2006.01) | |
| B05D 7/00 | (2006.01) | |
| B05D 1/00 | (2006.01) | |
| B05D 5/12 | (2006.01) | |

(52) U.S. Cl.
CPC ............... *B32B 17/10* (2013.01); *B05D 7/14* (2013.01); *C23C 14/14* (2013.01); *C23C 14/34* (2013.01); *C23C 28/027* (2013.01); *B05D 1/60* (2013.01); *B05D 5/12* (2013.01); *B05D 7/58* (2013.01); *B05D 2203/35* (2013.01); *B05D 2701/30* (2013.01)

(58) Field of Classification Search
CPC ....... C23C 28/027; C23C 14/14; C23C 14/34; B32B 17/064; B32B 15/04; B05D 7/14; B05D 2701/30; B05D 2203/35; B05D 5/12; B05D 7/58; B05D 1/60
See application file for complete search history.

(56) References Cited

U.S. PATENT DOCUMENTS

| | | |
|---|---|---|
| 4,355,221 A | 10/1982 | Lin |
| 5,105,291 A | 4/1992 | Matsumoto et al. |
| 8,678,316 B2 | 3/2014 | Rawlings et al. |

(Continued)

OTHER PUBLICATIONS

Liu, M. C., et al. "Assessing the interfacial strength of an amorphous-crystalline interface." Acta materialia 61.9 (2013): 3304-3313. (Year: 2013).*

(Continued)

*Primary Examiner* — Michael Zhang
(74) *Attorney, Agent, or Firm* — BakerHostetler

(57) ABSTRACT

A multilayer composite is provided. The composite may include a plurality of metallic glass layers interleaved with a plurality of polymer layers. The composite may have a thickness of up to 100 microns. The composite may have a fatigue strength of at least 1.5 times of the fatigue strength of a monolithic metallic glass having the same thickness as the composite and the same chemical composition as the metallic glass layer.

16 Claims, 5 Drawing Sheets

(56) References Cited

U.S. PATENT DOCUMENTS

| | | |
|---|---|---|
| 9,601,557 B2 | 3/2017 | Yang et al. |
| 2005/0116237 A1 | 6/2005 | Voutsas |
| 2014/0017482 A1* | 1/2014 | Tuffile ................... B32B 17/10 428/301.1 |
| 2014/0356575 A1* | 12/2014 | Villalobos ................ B32B 7/02 428/138 |
| 2016/0361897 A1* | 12/2016 | Hofmann ................ B32B 15/14 |

OTHER PUBLICATIONS

MIT, "PMMA," https://web.archive.org/web/20041027130542/http://www.mit.edu/~6.777/matprops/pmma.htm (Year: 2004).*

* cited by examiner

Log-Log plot of surface maximum stress $\sigma_{max}$ and half thickness $t$.

MULTILAYER COMPOSITE INCLUDING METALLIC GLASS AND POLYMER WITH REDUCED FATIGUE

PRIORITY

This disclosure claims the benefit under 35 U.S.C. § 119(e) of U.S. Provisional Patent Application Ser. No. 62/559,273, entitled "MULTILAYER COMPOSITE INCLUDING METALLIC GLASS AND POLYMER WITH REDUCED FATIGUE," filed on Sep. 15, 2017, which is incorporated herein by reference in its entirety.

FIELD

The disclosure is directed to multilayer composite including a number of metallic glass layers interleaved with a number of polymer layers. Additionally, the disclosure is directed to methods of making the multilayer composite. Additionally, the multilayer composite can be used as a metallic backing plate for a flexible monitor.

BACKGROUND

There is a need for surface components that are flexible, while also having high fatigue strength. In some aspects, this would allow a surface component to be foldable while otherwise remaining unchanged. For example, a flexible monitor requires a foldable screen. The foldable screen may need a flexible backplate as a structural support. Conventionally available materials are not suitable for this type of flexible backplate. There remains a need to develop a flexible material that has increased fatigue strength and reduced plastic deformation, compared to conventional materials.

BRIEF SUMMARY

The disclosure provides a multilayer composite including metallic glass layers interleaved with polymer layers. The multilayer composite provides higher fatigue strength than a monolithic metallic glass layer of the same thickness. The disclosure provides composite structure, properties, and methods of making the multilayer composite.

In an embodiment, a multilayer composite may include a plurality of metallic glass layers interleaved with a plurality of polymer layers. The composite may have a thickness of up to 100 microns. The composite may have a fatigue strength of at least 1.5 times of the fatigue strength of a monolithic metallic glass having the same thickness as the composite and the same chemical composition as the metallic glass layer.

In some embodiments, each of the plurality of metallic glass layers and the plurality of polymer layers may have a thickness up to 50 microns.

In some embodiments, the polymer layer may be thinner than the metallic glass layer.

In some embodiments, the polymer layer may have the same thickness as the metallic glass layer.

In some embodiments, the polymer may be selected from the group consisting of polyimide, COP, and acrylic polymer.

In some embodiments, the metallic glass may include a material selected from the group consisting of Zr-based, Ni-based, Fe-based, Cu-based, Al-based, Pt-based, Pd-based, Au-based, Ag-based, Co-based, Mg-based, and Ti-based metallic glass.

In some embodiments, the composite may have a volume ratio of the polymer to the metallic glass of at least 0.1.

In some embodiments, the polymer layer may have a thickness of at least 10% of the thickness of the metallic glass layer.

In some embodiments, the composite may be substantially free of plastic deformation after 180 degree folding test.

In some embodiments, the polymer may have a Young's modulus of at least 10 times smaller than that of the metallic glass.

In an embodiment, a method is provided to form a multilayer composite. The method may include depositing a first polymer layer over an adhesive substrate. The method may also include depositing a first metallic glass layer over the first polymer layer. The method may further include depositing a second polymer layer over the first metallic glass layer. The method may also include depositing a second metallic glass layer over the second polymer layer. The composite has a thickness of up to 100 microns, and wherein the multilayer composite has a fatigue strength of at least 1.5 times of the fatigue strength of a monolithic metallic glass having the same thickness as the composite and the same chemical composition as the metallic glass layer.

In some embodiments, the step of depositing a metallic glass layer may include physical vapor deposition or sputtering.

In some embodiments, the step of depositing a polymer layer may include chemical vapor deposition.

In some embodiments, the metallic glass may include a material selected from the group consisting of Zr-based, Ni-based, Fe-based, Cu-based, Al-based, Pt-based, Pd-based, Au-based, Ag-based, Co-based, Mg-based, and Ti-based metallic glass.

In some embodiments, the composite may have a volume ratio of the polymer to the metallic glass of at least 0.1.

In some embodiments, each of the metallic glass layer and the polymer layers may have a thickness of up to 50 microns.

In an embodiment, a multilayer composite may include a plurality of metal layers interleaved with a plurality of polymer layers. The composite has a thickness of up to 100 microns, and wherein the composite has a fatigue strength of at least 1.5 times of the fatigue strength of a monolithic metal layer having the same thickness as the composite.

In some embodiments, at least one of the plurality of metal layers may include a crystalline phase.

In some embodiments, at least one of the plurality of metal layers may include one of a shape memory alloy and a superelastic alloy.

Additional embodiments and features are set forth in part in the description that follows, and will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

Composite Structure and Properties

The present disclosure is directed to a multilayer composite including a number of a plurality of layers of metallic glass interleaved with a plurality of polymer layers. The multilayer composite can combine the high fatigue strength of the polymer and the low plastic deformation of the metallic glass. Each of the metallic glass layer and the polymer layer may be designed to be very thin (e.g. 50 μm), such that the multilayer composite is flexible, and has high Young's modulus, high fatigue strength, and low plastic deformation after a 180 degree folding test. By having a very thin individual metallic glass layer, the surface tension of the metallic glass can be reduced significantly under fatigue loading compared to a thick metallic glass layer.

A multilayer composite may have one or more of various properties. These properties can include low plastic deformation, high strength and high modulus, high impact fracture toughness, high elastic limit, and high fatigue strength.

Metallic glasses have low plastic deformation, high strength, high Young's modulus, high toughness, and very good elastic strain (e.g. 2%). However, metallic glass has poor fatigue strength.

Conventional crystalline metals may be not suitable for the flexible backplate. For example, conventional crystalline metals or metal alloys have high strength, good toughness, and good fatigue strength, but high plastic deformation and low elastic strain limit (e.g. 0.2%). Metals are also not suitable for the flexible backplate, mostly due to high plastic deformation.

Conventional polymers when alone have good fatigue strength, good impact toughness, and very good elastic strain limit (e.g. 4%). However, polymers have relatively low strength and low Young's modulus. Polymers are also easy to have plastic deformation after fatigue tests. As such, polymers are not suitable for the flexible backplate mostly due to high plastic deformation.

Conventional oxide glasses may also be not suitable for the flexible backplate. Conventional oxide glasses do not have much plastic deformation. However, glasses are brittle (i.e. extremely low elastic strain limit) and have low impact toughness and poor fatigue strength. Therefore, glasses are not suitable for making the flexible plate.

Figure 1:
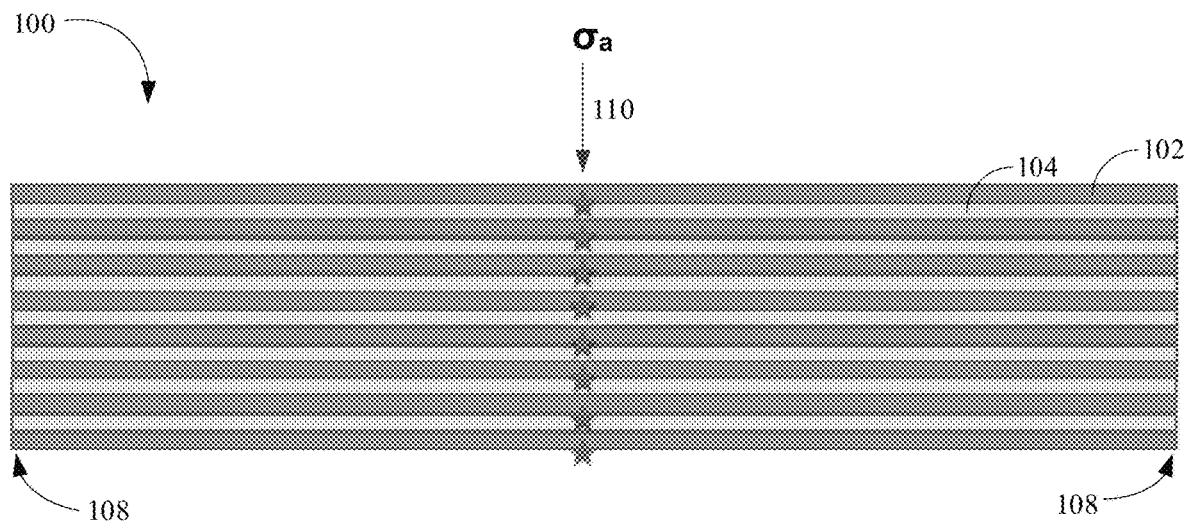
FIG. 1 shows a schematic illustration of cross-section of a multilayer composite including metallic glass and polymer in accordance with various embodiments of the disclosure.

FIG. 1 shows a schematic illustration of a cross-section of a multilayer composite including metallic glass and polymer in accordance with various embodiments of the disclosure. As shown, a multilayer composite 100 may include a plurality of metallic glass layers 102 and a plurality of polymer layers 104. Each polymer layer 104 is positioned between two adjacent metallic glass layers, i.e. the polymer layers 104 are interleaved with the metallic glass layers 102. The metallic glass layer and the polymer layer are so thin that the metallic glass layer adheres to the polymer without using any adhesive layer. In some embodiments, two opposite outer surfaces of the multilayer composite include a metallic glass layer. As shown in FIG. 1, at the bottom surface of the composite, arrows 108 illustrate that forces are applied to the bottom of the composite 100 near the ends of the composite. An arrow 110 illustrates a stress $\sigma_a$ is applied toward the top surface of the composite 100. The composite is under a bending loading as illustrated.

The multilayer composite 100 may have at least 1.5 times of the fatigue strength compared to a monolithic metallic glass layer of the same thickness as the composite, assuming the metallic glass of the composite the same as the monolithic metallic glass. In some embodiments, the multilayer composite 100 may have at least 2.0 times of the fatigue strength compared to a monolithic metallic glass layer of the same thickness as the composite. In some embodiments, the multilayer composite 100 may have at least 2.5 times of the fatigue strength compared to a monolithic metallic glass layer of the same thickness as the composite. In some embodiments, the multilayer composite 100 may have at least 3.0 times of the fatigue strength compared to a monolithic metallic glass layer of the same thickness as the composite.

Metallic Glasses

The metallic glass may vary in Young's modulus and elastic strain limit. Also, the metallic glass may vary in cost and commercial availability. In some embodiments, the metallic glass may be Zr-based, Ni-based, Fe-based, Cu-based, Al-based, Pt-based, Pd-based, Au-based, Ag-based, Co-based, Mg-based, and Ti-based, among others.

In some non-limiting aspects, the metallic glass can be based on, or alternatively include, one or more elements that oxidize, such as Zr, Ti, Ta, Hf, Mo, W, and Nb. In some variations, the metallic glass includes at least about 30% of one or more of Zr, Ti, Ta, Hf, Mo, W, and Nb. In some variations, the metallic glass includes at least about 40% of one or more of Zr, Ti, Ta, Hf, Mo, W and Nb. In some variations, the metallic glass includes at least about 50% of one or more of Zr, Ti, Ta, Hf, Mo, W and Nb. In certain embodiments, the metallic glass can be based on, or alternatively include, Zr. In some variations, the metallic glass includes at least about 30% Zr. In some variations, the metallic glass includes at least about 40% Zr. In some variations, the metallic glass includes at least about 50% Zr. In some aspects, the alloy is a marginal glass forming alloy.

The metallic glass can include multiple transition metal elements, such as at least two, at least three, at least four, or more, transitional metal elements. The metallic glass can also optionally include one or more nonmetal elements, such as one, at least two, at least three, at least four, or more, nonmetal elements. A transition metal element can be any of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, meitnerium, ununnilium, unununium, and ununbium. In one embodiment, a metallic glass containing a transition metal element can have at least one of Sc, Y, La, Al, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, and Hg. Depending on the application, any suitable transitional metal elements, or their combinations, can be used.

In some embodiments, the metallic glass described herein can be fully alloyed. The term fully alloyed used herein can account for minor variations within the error tolerance. For example, it can refer to at least 90% alloyed, such as at least 95% alloyed, such as at least 99% alloyed, such as at least 99.5% alloyed, or such as at least 99.9% alloyed. The percentage herein can refer to either volume percent or weight percentage, depending on the context. These percentages can be balanced by impurities, which can be in terms of composition or phases that are not a part of the alloy. The alloys can be homogeneous or heterogeneous, e.g., in composition, distribution of elements, amorphicity/crystallinity, etc.

The metallic glass can include any combination of the above elements in its chemical formula or chemical composition. The elements can be present at different weight or volume percentages. Alternatively, in one embodiment, the above-described percentages can be volume percentages, instead of weight percentages.

In certain embodiments, the metallic glass can be zirconium-based. The metallic glass can also be substantially free of various elements to suit a particular purpose. For example, in some embodiments, the metallic glass can be substantially free of nickel, aluminum, titanium, beryllium, or combinations thereof. In one embodiment, the alloy or the composite is completely free of nickel, aluminum, titanium, beryllium, or combinations thereof.

The described metallic glass can further include additional elements, such as additional transition metal elements, including Nb, Cr, V, and Co. The additional elements can be present at less than or equal to about 30 wt. %, less than or equal to about 20 wt. %, less than or equal to about 10 wt. %, or less than or equal to about 5 wt. %. In one embodiment, the additional, optional element is at least one of cobalt, manganese, zirconium, tantalum, niobium, tungsten, yttrium, titanium, vanadium, and hafnium to form carbides and further improve wear and corrosion resistance. Further optional elements can include phosphorous, germanium, and arsenic, totaling up to about 2%, or less than 1%, to reduce the melting point. Otherwise incidental impurities should be less than about 2% or less than 0.5%.

In some embodiments, the metallic glass can include a small amount of impurities. The impurity elements can be intentionally added to modify the properties of the composition, such as improving the mechanical properties (e.g., hardness, strength, fracture mechanism, etc.) and/or improving the corrosion resistance. Alternatively, the impurities can be present as inevitable, incidental impurities, such as those obtained as a byproduct of processing and manufacturing. The impurities can be less than or equal to about 10 wt. %, about 5 wt. %, about 2 wt. %, about 1 wt. %, about 0.5 wt. %, or about 0.1 wt. %. In some embodiments, these percentages can be volume percentages instead of weight percentages.

In some embodiments, the metallic glass layer has a thickness equal to or less than 0.5 µm. In some embodiments, the metallic glass layer has a thickness equal to or less than 0.4 µm. In some embodiments, the metallic glass layer has a thickness equal to or less than 0.3 µm. In some embodiments, the metallic glass layer has a thickness equal to or greater than 0.2 µm. In some embodiments, the metallic glass layer has a thickness equal to or greater than 0.3 µm. In some embodiments, the metallic glass layer has a thickness equal to or greater than 0.4 µm.

Polymers

In some embodiments, the multilayer composite may include a polymer that has relatively high Young's modulus. For example, the polymer may be polyimide (PI), cyclo-olefin polymer (COP), or acrylic polymer, among others. The Young's modulus of the multilayer composite may also vary with the Young's modulus of the polymer. The polyimide and COP have higher strength or higher Young's modulus than elastomers or rubber. Also, the polyimide and COP are tested and found to be less susceptible to plastic deformation after fatigue tests.

When the multilayer composite uses the high Young's modulus polymer, the overall thickness can be thin. When the multilayer composite uses relatively low Young's modulus polymer, the thickness of the polymer may be increased to compensate for the decrease in the Young's modulus of the polymer to obtain the desired modulus of the multilayer composite.

One layer of metallic glass may move laterally along the surface of the polymer layer in the multilayer composite during fatigue loading. When a polymer with a lower Young's modulus is used in the multilayer composite, the metallic glass layer may slip more easily than the multilayer composite having a polymer with a higher Young's modulus. The lower Young's modulus of the polymer may help improve the fatigue strength of the multilayer composite. However, when the polymer with a lower Young's modulus is used in the multilayer composite, the polymer layer may be more susceptible to plastic deformation than the polymer with higher Young's modulus.

In some embodiments, the polymer may be thermally conductive or electrically conductive. For example, a conductive material, such as carbon black, may be added to the polymer to make it thermally conductive or electrically conductive.

In some embodiments, the polymer layer has a thickness less than 50 µm. In some embodiments, the polymer layer has a thickness less than 45 µm. In some embodiments, the polymer layer has a thickness less than 40 µm. In some embodiments, the polymer layer has a thickness less than 35 µm. In some embodiments, the polymer layer has a thickness less than 30 µm. In some embodiments, the polymer layer has a thickness less than 25 µm. In some embodiments, the polymer layer has a thickness less than 20 µm. In some embodiments, the polymer layer has a thickness less than 15 µm. In some embodiments, the polymer layer has a thickness less than 10 µm. In some embodiments, the polymer layer has a thickness less than 5 µm. In some embodiments, the polymer layer has a thickness less than 3 µm. In some embodiments, the polymer layer has a thickness less than 2.5 µm. In some embodiments, the polymer layer has a thickness less than 2.0 µm. In some embodiments, the polymer layer has a thickness less than 1.5 µm. In some embodiments, the polymer layer has a thickness greater than 1 µm. In some embodiments, the polymer layer has a thickness greater than 1.5 µm. In some embodiments, the polymer layer has a thickness greater than 2.0 µm. In some embodiments, the polymer layer has a thickness greater than 2.5 µm. In some embodiments, the polymer layer has a thickness greater than 3 µm. In some embodiments, the polymer layer has a thickness greater than 5 µm. In some embodiments, the polymer layer has a thickness greater than 10 µm. In some embodiments, the polymer layer has a thickness greater than 15 µm. In some embodiments, the polymer layer has a thickness greater than 20 µm. In some embodiments, the polymer layer has a thickness greater than 25 µm. In some embodiments, the polymer layer has a thickness greater than 30 µm. In some embodiments, the polymer layer has a thickness greater than 35 µm. In some embodiments, the polymer layer has a thickness greater than 40 µm. In some embodiments, the polymer layer has a thickness greater than 45 µm.

Turning again to FIG. 1, in some embodiments, the metallic glass layers may be replaced by some crystalline metal layers in the multilayer composite 100. The metal layers may be in a crystalline phase. The metal layers may include one of a shape memory alloy or a rubber alloy, among others. The multilayer composite may still have a thickness of up to 100 microns. Also, the multilayer composite may have a fatigue strength of at least 1.5 times the fatigue strength of a monolithic metal layer having the same thickness as the multilayer composite. The crystalline metals in the multilayer composite can easily form persistent slip bands under cyclic loading and thus improve fatigue strength of the multilayer composite. In general, crystalline metal also has comparably small plastic deformation to the metallic glass. The structural effect of the crystalline metal film may also affect the fatigue ratio. This is because the metals easily form persistent slip bands under cyclic loading. Some of the crystalline metals show super-elastic properties, such as rubber metals, shape memory alloys among others. These crystalline metals have lower plastic deformation than conventional metals.

It will be appreciated by those skilled in the art that the multilayer composite structure may vary in various embodiments. The structure is not limited to those examples.

The multilayer composite can make a folding part because of the improved fatigue strength of the multilayer composite over the monolithic metallic glass. The thin individual layers in the multilayer composite can reduce surface tension under fatigue loading. The polymer has a very low Young's modulus that may be two orders lower than the Young's modulus of the metallic glass. As such, the metallic glass layers 102 may slip to each other via the thin polymer layers 104. The stress condition of each metallic glass layer or film in the multilayer composite 100 is nearly the same.

If the metallic glass layer cracks due to fatigue loading, crack propagation may be difficult in the multilayer composite 100. The polymer layer or film 104 between two adjacent metallic glass layers 102 may act as a buffer layer to absorb the energy from crack propagation and to prevent crack propagation from the metallic glass layer 102 to the outer surface where maximum stress is applied during a 180 degree folding test.

Figure 2:
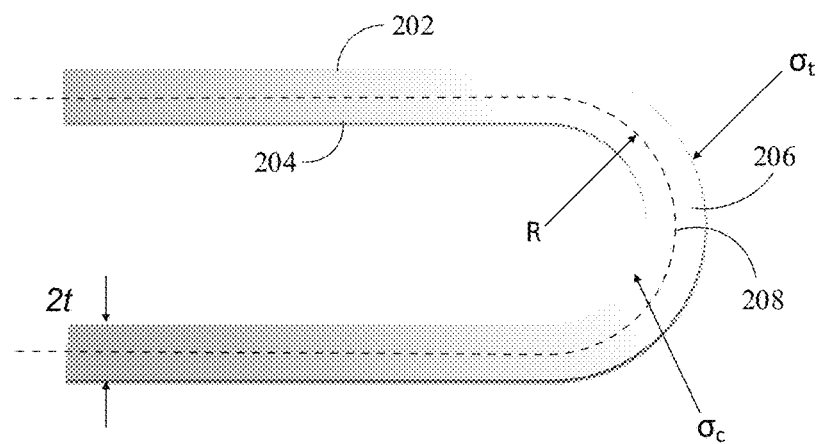
FIG. 2 shows a schematic illustration of strain of a folding part in accordance with various embodiments of the disclosure.

FIG. 2 shows a schematic illustration of strain of a folding part in accordance with various embodiments of the disclosure. As shown, the folding part 200 is in a sheet form and has a uniform thickness. The folding part 200 is bent 180 degrees in a middle section such that the folding part has a curved middle section with a bending radius of 2 mm. The folding part 200 includes an outer surface 202 under a tension $\sigma_t$ and an inner surface 204 under a compression $\sigma_c$. A neutral surface 206 is half-way between the inner surface 204 and the outer surface 202. The neutral surface 206 is stress free.

In some embodiments, the radius for the folding test is equal to or lower than 5 mm. In some embodiments, the radius for the folding test is equal to or lower than 4 mm. In some embodiments, the radius for the folding test is equal to or lower than 3 mm. In some embodiments, the radius for the folding test is equal to or lower than 2 mm. In some embodiments, the radius for the folding test is equal to or lower than 1 mm.

The multilayer composite 100 in FIG. 1 may have a total thickness up to 100 µm. The thickness of the multilayer composite may affect the plastic deformation. When the thickness decreases, the likelihood of plastic deformation decreases. The multilayer composite can be thin enough to be substantially free of plastic deformation after the 180 degree folding test. In some embodiments, the plastic deformation may be within a 2% strain for a 5 mm radius during the folding test. In some embodiments, the plastic deformation is 1% strain for a 3 mm radius during the folding test. Thicker metallic glass layer may reveal plastic deformation after fatigue tests. Fatigue experiments have demonstrated that when a monolithic metallic glass layer has a thickness exceeding 100 µm for bending radius of 5 mm, the monolithic metallic glass may reveal plastic deformation after a number of 180 degree folding cycles, e.g. 10,000 cycles. Based upon the fatigue experiments with the monolithic metallic glass, the multilayer composite may be limited to 100 µm or less in thickness.

In some embodiments, the multilayer composite has a thickness less than 100 µm. In some embodiments, the multilayer composite has a thickness less than 90 µm. In some embodiments, the multilayer composite has a thickness less than 80 µm. In some embodiments, the multilayer composite has a thickness less than 70 µm. In some embodiments, the multilayer composite has a thickness less than 60 µm. In some embodiments, the multilayer composite has a thickness less than 50 µm. In some embodiments, the multilayer composite has a thickness less than 40 µm. In some embodiments, the multilayer composite has a thickness less than 30 µm. In some embodiments, the multilayer composite has a thickness less than 25 µm. In some embodiments, the multilayer composite has a thickness less than 20 µm. In some embodiments, the multilayer composite has a thickness less than 15 µm.

Without wishing to be limited to a particular property, the thickness can provide structural support. In some embodiments, the multilayer composite may have a thickness of at least 10 µm. In some embodiments, the multilayer composite has a thickness at least 15 µm. In some embodiments, the multilayer composite has a thickness at least 20 µm. In some embodiments, the multilayer composite has a thickness at least 25 µm. In some embodiments, the multilayer composite has a thickness at least 30 µm. In some embodiments, the multilayer composite has a thickness at least 40 µm. In some embodiments, the multilayer composite has a thickness at least 50 µm. In some embodiments, the multilayer composite has a thickness at least 60 µm. In some embodiments, the multilayer composite has a thickness at least 70 µm. In some embodiments, the multilayer composite has a thickness at least 80 µm. In some embodiments, the multilayer composite has a thickness at least 90 µm.

It will be appreciated by those skilled in the art that the fatigue strength may vary with the type of metallic glass, or modulus of the metallic glass. The fatigue ratio may also be higher if there are no defects, or reduced defects in the material.

The Young's modulus of the multilayer composite may vary with the volume percent of the polymer. In some embodiments, the multilayer composite may include at least 10% by volume of polymer. In some embodiments, the multilayer composite may include at least 20% by volume of polymer. In some embodiments, the multilayer composite may include at least 30% by volume of polymer. In some embodiments, the multilayer composite may include at least 40% by volume of polymer. In some embodiments, the multilayer composite may include at least 50% by volume of polymer.

The elastic limit of the multilayer composite may be between the elastic limit of polymer and the elastic limit of the metallic glass. The elastic limit of the polymer is higher than the metallic glass. For example, the polymer may have the elastic strain limit of about 4%, while the metallic glass may have the elastic strain limit of about 2%.

In some embodiments, the polymer layer may have the same thickness as the metallic glass layer. In alternative embodiments, the polymer layer may be thicker than the metallic glass layer. In other embodiments, the polymer layer may be thinner than the metallic glass layer.

In some embodiments, the polymer layer may have a thickness of at least 10% of the thickness of the metallic glass layer. In some embodiments, the polymer layer may have a thickness of at least 20% of the thickness of the metallic glass layer. In some embodiments, the polymer layer may have a thickness of at least 30% of the thickness of the metallic glass layer. In some embodiments, the polymer layer may have a thickness of at least 40% of the thickness of the metallic glass layer. In some embodiments, the polymer layer may have a thickness of at least 50% of the thickness of the metallic glass layer. In some embodiments, the polymer layer may have a thickness of at least 60% of the thickness of the metallic glass layer. In some embodiments, the polymer layer may have a thickness of at least 70% of the thickness of the metallic glass layer. In some embodiments, the polymer layer may have a thickness of at least 80% of the thickness of the metallic glass layer. In some embodiments, the polymer layer may have a thickness of at least 90% of the thickness of the metallic glass layer. In some embodiments, the polymer layer may have a thickness of at least 100% of the thickness of the metallic glass layer.

In some embodiments, the metallic glass layer may have a thickness of at least 10% of the thickness of the polymer layer. In some embodiments, the metallic glass layer may have a thickness of at least 20% of the thickness of the polymer layer. In some embodiments, the metallic glass layer may have a thickness of at least 30% of the thickness of the polymer layer. In some embodiments, the metallic glass layer may have a thickness of at least 40% of the thickness of the polymer layer. In some embodiments, the metallic glass layer may have a thickness of at least 50% of the thickness of the polymer layer. In some embodiments, the metallic glass layer may have a thickness of at least 60% of the thickness of the polymer layer. In some embodiments, the metallic glass layer may have a thickness of at least 70% of the thickness of the polymer layer. In some embodiments, the metallic glass layer may have a thickness of at least 80% of the thickness of the polymer layer. In some embodiments, the metallic glass layer may have a thickness of at least 90% of the thickness of the polymer layer. In some embodiments, the metallic glass layer may have a thickness of at least 100% of the thickness of the polymer layer.

In some embodiments, the multiplayer composite may be shaped in a sheet form. In alternative embodiments, the multilayer composite may be shaped in a rod, a tube, or any other shapes.

In some embodiments, the polymer layer may have varying thicknesses in the multilayer composite. For example, the polymer layer may be thinner near the outer surface 202 during bending than the polymer layer near the inner surface 204. A thinner polymer layer may yield less plastic deformation than a thicker polymer layer. The polymer layer near the outer surface 202 is more susceptible to plastic deformation than the polymer layer near the inner surface.

Figure 3:
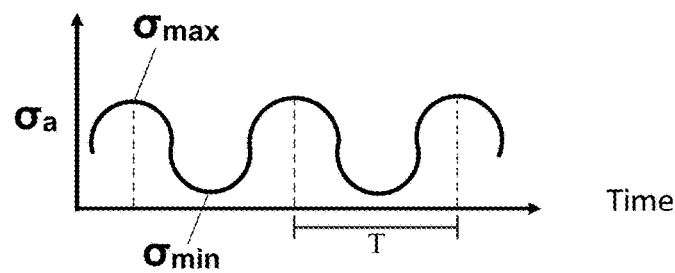
FIG. 3 shows a schematic illustration of cyclic stress versus time for the folding part of FIG. 2 in accordance with various embodiments of the disclosure.

FIG. 3 shows a schematic illustration of cyclic stress versus time for the folding part of FIG. 2 in accordance with various embodiments of the disclosure. As shown in FIG. 3, the cyclic stress $\sigma_a$ changes with time in a repetitive pattern. Specifically, a cyclic stress $\sigma_a$ increases to a maximum stress value $\sigma_{max}$ during a first half time period of T and decreases to a minimum stress value $\sigma_{min}$ during a second half time period of T. The cyclic stress $\sigma_a$ can be determined based upon the stress versus cycle number to failure (S-N) curve for a particular metallic glass. Fatigue strength is a property of materials. Fatigue strength is the amplitude of cyclic stress that can be applied to the material without causing fatigue failure. Some materials, such as metallic glasses, have a distinct stress limit, i.e. fatigue strength. When a stress amplitude is below the fatigue strength, there will be no fatigue failure after an endless number of cycles. Generally, the fatigue strength is about 20% to 25% of the yield strength of the metallic glass, which means that a fatigue ratio of the fatigue strength to yield strength is about 20 to 25% for metallic glasses.

Figure 4:
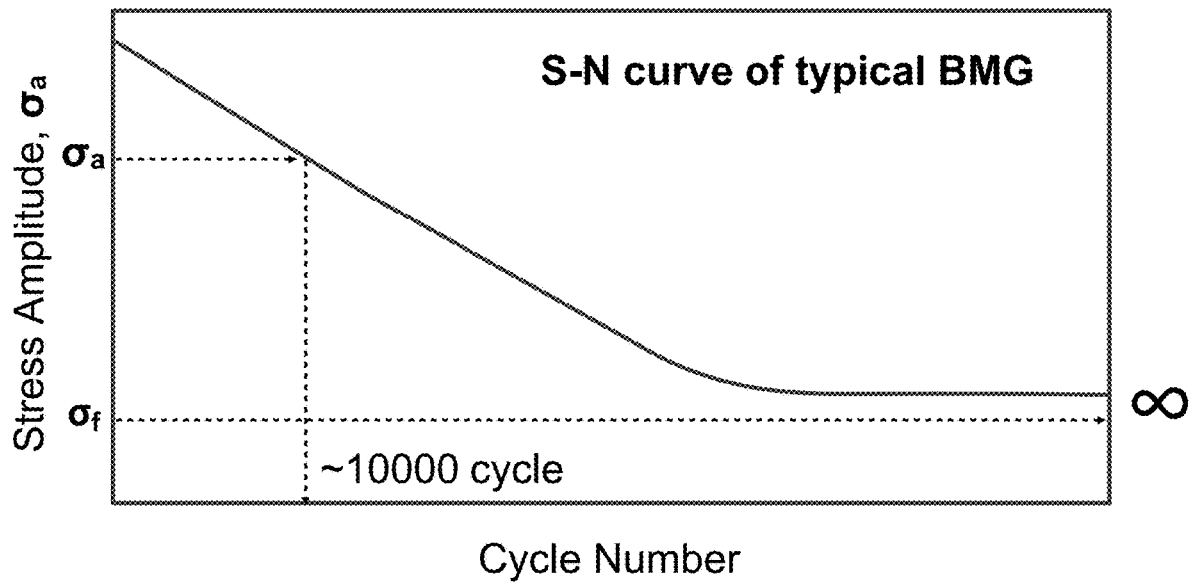
FIG. 4 shows a schematic illustration of stress amplitude versus cycle number for a typical metallic glass.

The maximum stress amplitude $\sigma_{max}$ max may vary with the desired cycle number. FIG. 4 shows a schematic illustration of stress amplitude versus cycle number for a typical metallic glass. When the stress amplitude increases, the cycle number decreases. Once the stress amplitude decreases to a fatigue stress limit $\sigma_f$, the cycle number to failure can increase to an infinite number. The fatigue stress limit may also be referred to as fatigue strength. The fatigue strength is a constant for a particular metallic glass, and is independent of the cycle number. As shown in FIG. 4, for a desired cycle number of 10,000, the maximum stress amplitude $\sigma_{max}$ can be obtained from the S-N curve for a particular metallic glass.

Some metals, such as ferrous alloys and titanium alloys, have the fatigue limit as shown in FIG. 4. However, other metals, such as aluminum and copper, do not have the plateau, or fatigue stress limit, as shown in FIG. 4.

The fatigue strength of the metallic glass layer can be improved when the monolithic metallic glass is thin. In other words, when the thickness of the metallic glass layer is reduced, the stress amplitude $\sigma_a$ decreases. According to the S-N curve, the cycle number increases when the stress amplitude $\sigma_a$ decreases.

The relationship between the maximum stress and the thickness can be calculated based upon the geometry shown in FIG. 2 assuming that a metallic glass film has a thickness of 200 µm, a half thickness of 100 µm, and a radius of 2 mm for the folding plate.

Figure 5:
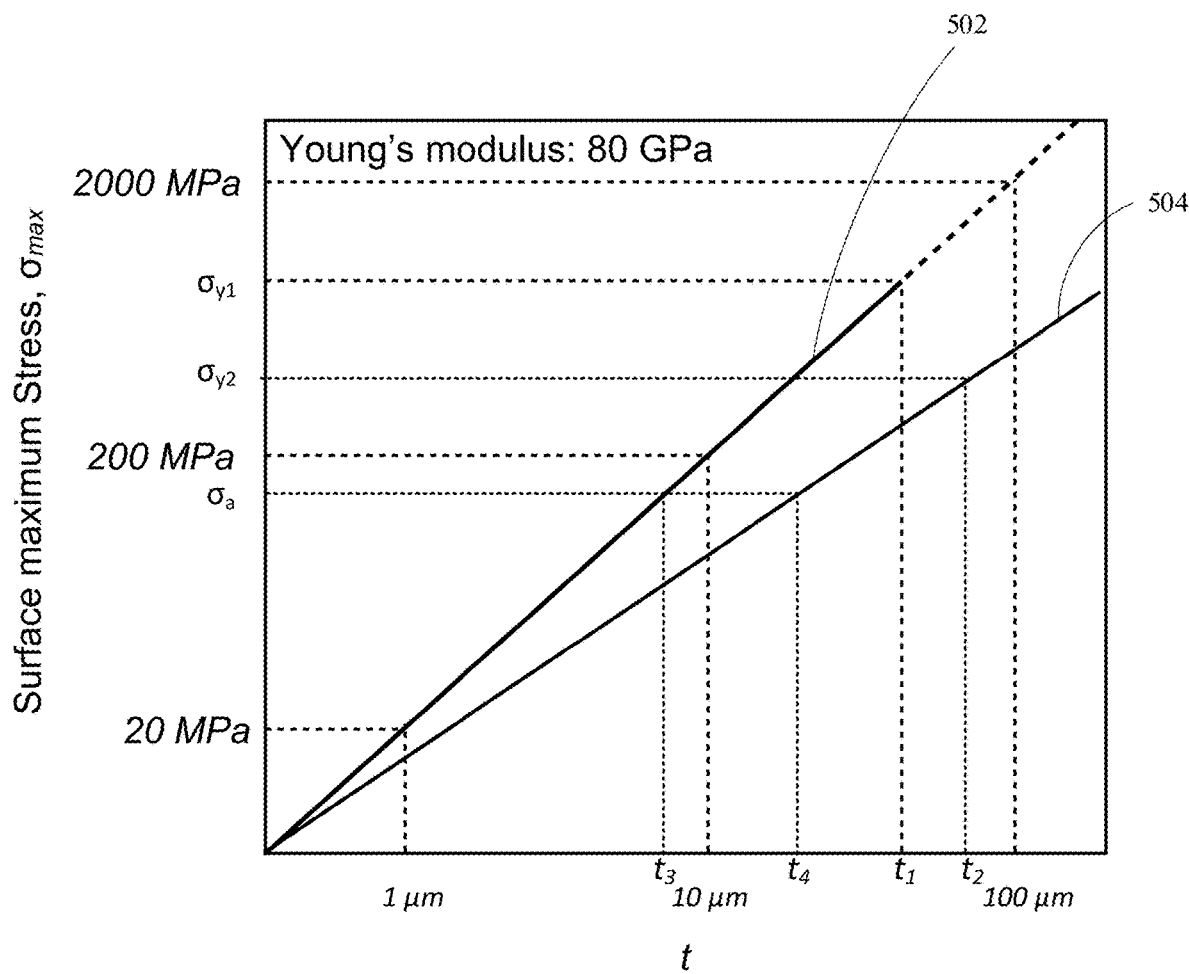
FIG. 5 shows a schematic illustration of maximum stress versus half thickness of FIG. 2 in accordance with various embodiments of the disclosure.

FIG. 5 shows log-to-log plots of surface maximum stress and half thickness in accordance with various embodiments of the disclosure. As an example, curve 502 is an estimation for a given Young's modulus of 80 GPa for most Zr-based metallic glasses, based upon the geometry shown in FIG. 2. As shown in FIG. 5, the surface maximum stress $\sigma_{max}$ in a log scale linearly increases with the half thickness in a log scale. For example, when $\sigma_{max}$ is 2000 MPa, the half thickness is 100 µm. When $\sigma_{max}$ is 200 MPa, the half thickness is 10 µm. When $\sigma_{max}$ is 20 MPa, the half thickness is 1 µm. When the monolithic metallic glass layer becomes about 200 µm thick, for a 2 mm radius curvature folding as shown in FIG. 2, the maximum stress level would reach 2000 MPa, which is higher than the yield strength of most Zr-based metallic glasses. As such, the monolithic metallic glass layer cannot be too thick, for example exceeding 100 µm.

The thickness may increase with decreased Young's modulus. For illustration purposes, curve 504 illustrates a lower Young's modulus with a smaller slope than curve 502. As shown in FIG. 5, the yield strength $\sigma_{y1}$ corresponds to a half thickness $t_1$ between 10 µm and 100 µm along curve 502, and $\sigma_{y1}$ is lower than 2000 MPa for most Zr-based metallic glasses. The yield strength $\sigma_{y2}$ is lower for curve 504 with a lower Young's modulus. The half thickness $t_2$ corresponds to the yield strength $\sigma_{y2}$ on the curve 504, and is larger than the half thickness $t_1$ for the higher Young's modulus metallic glass.

As shown in FIG. 5, for a desired surface maximum stress $\sigma_{max}$ that is lower than the yield strength $\sigma_{y1}$ or $\sigma_{y2}$, a half thickness $t_4$ corresponding to the lower Young's modulus material (i.e. curve 504) is larger than a half-thickness $t_3$ corresponding to the high Young's modulus material (i.e. curve 502).

Figure 6:
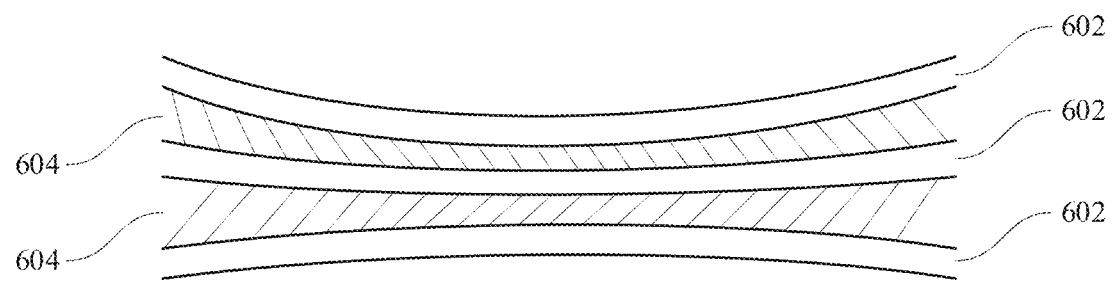
FIG. 6 shows a schematic illustration of cross-section of a multilayer composite with varying thickness in accordance with various embodiments of the disclosure.

In some embodiments, the multilayer composite may have varying thicknesses. For example, the thickness of the polymer layer may vary from a middle portion to an end portion. FIG. 6 shows a schematic illustration of cross-section of a multilayer composite with varying thickness in accordance with various embodiments of the disclosure. The multilayer composite 600 includes a number of metallic glass layers 602 interleaved with a number of polymer layers 604. As shown, end portions 608 of the multilayer composite 600 are thicker than a middle portion 606 of the multilayer composite. The polymer layer 604 is thicker near the end portion 608 than near the middle portion 606. In this embodiment, the metallic glass layer 602 has a uniform thickness.

Figure 7:
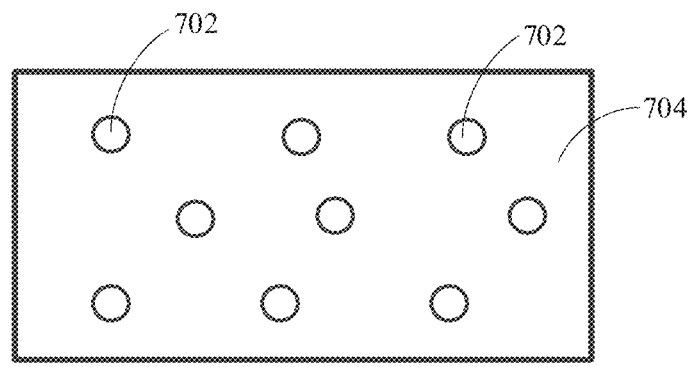
FIG. 7 shows a schematic illustration of a top view of a multilayer composite with holes in accordance with various embodiments of the disclosure.

In some embodiments, a number of through-holes may be cut through the multilayer composite perpendicular to the surface of the multilayer composite. The through-holes may be filled with polymers. FIG. 7 shows a schematic illustration of a top view of a multilayer composite with holes in accordance with various embodiments of the disclosure. The through-holes 702 may be cut through the multilayer composite 704. It will be appreciated by those skilled in the art that the arrangement of the through-holes 702 may vary and the through-hole size may also vary. The through-holes 702 may help increase the adhesion of the polymer to the metallic glass.

Figure 8:
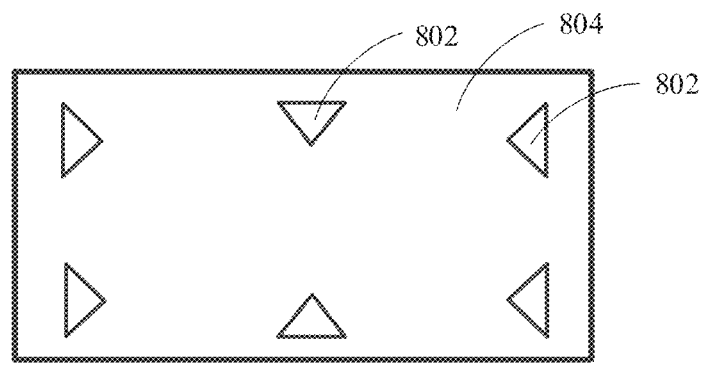
FIG. 8 shows a schematic illustration of a top view of a multilayer composite with cutout areas in accordance with various embodiments of the disclosure.

In some embodiments, a number of cutouts may be made through the multilayer composite perpendicularly to the surface of the multilayer composite. The cutouts may reduce the total modulus of the multilayer composite. FIG. 8 shows a schematic illustration of a top view of a multilayer composite with cutout areas in accordance with various embodiments of the disclosure. As shown, the cutout 802 in the multilayer composite 804 may be in a triangle shape or other shape, such as square or rectangle among others.

Again, the size and shape of the cutout 802 may vary. Also, the arrangement of the cutout 802 may vary.

In some embodiments, local cutout may be made through the multilayer composite perpendicular to the surface of the multilayer composite. The local cutout may increase the local flexibility of the multilayer composite.

Figure 9:
FIG. 9 shows a schematic illustration of a top view of a multilayer composite with slots in accordance with various embodiments of the disclosure.

FIG. 9 shows a schematic illustration of a top view of a multilayer composite with slots in accordance with various embodiments of the disclosure. As shown in FIG. 9, the cutout may be a number of slots 902 in the multilayer composite 904. Again, the size and shape of the slots 902 may vary. Also, the arrangement of the slots 902 may vary.

Processes

A method is provided to fabricate the multiplayer composite. The method may include depositing a first polymer layer over an adhesive substrate, followed by depositing a first metallic glass layer over the first polymer layer. The method may also include depositing a second polymer layer over the first metallic glass layer, followed by depositing a second metallic glass layer over the second polymer layer. The method continues with depositing the polymer layer and the metallic glass layer alternately.

In some embodiments, the metallic glass may be deposited by physical vapor deposition (PVD) or sputtering, among others. In some embodiments, the polymer layer may be deposited over the metallic glass layer by chemical vapor deposition (CVD) or spray. Spray may deposit a thicker layer than the CVD.

In some embodiments, the fabricated multiplayer composite has a thickness of up to 100 microns. The multilayer composite has a fatigue strength of at least 1.5 times of the fatigue strength of a monolithic metallic glass having the same thickness as the multilayer composite and the same chemical composition as the metallic glass layer.

Applications

Figure 10:
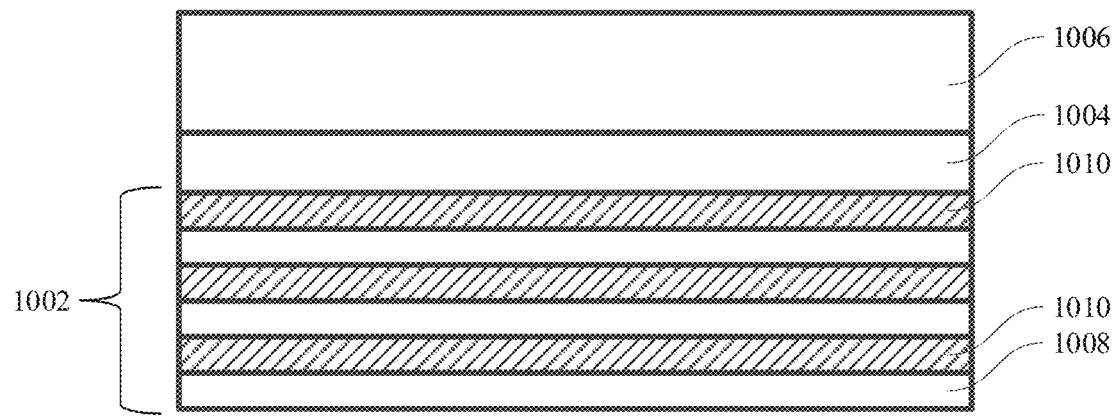
FIG. 10 shows a schematic illustration of cross-section of the multilayer composite used in a flexible monitor in accordance with various embodiments of the disclosure.

The multilayer composite can be used in conjunction with any surface. The multilayer composite may be used for a flexible monitor or display. The flexible monitor can be folded to be a compact component easy for carrying. FIG. 10 shows a schematic illustration of a cross-section of the multilayer composite used in a flexible monitor in accordance with various embodiments of the disclosure. As shown in FIG. 10, an adhesive layer 1004 may be positioned between the multilayer composite 1002 and the monitor 1006 of a flexible display. Also, the multilayer composite includes a metallic glass layer 1008 on an outer surface 1012, because the metallic glass has higher strength and higher abrasion resistance than the polymer. The multilayer composite may include a polymer layer 1010 on an inner surface 1014 that contacts the adhesive layer 1004, as shown in FIG. 10. The adhesive may bond better to the polymer layer than to the metallic glass layer. Alternatively, an inner surface layer may include a metallic glass layer (not shown), which may depend upon the type of the adhesive used for the adhesive layer 1004.

In some embodiments, the adhesive may have a thickness up to 100 µm. For example, the adhesive layer may be at least 15 µm, 20 µm or 25 µm thick as described herein. The adhesive layer may be at least 10 µm thick. Without wishing to be limited to a particular property, the adhesive layer may be thick enough to provide good bonding to the monitor.

In some embodiments, the multilayer composite may be used in a speaker cover housing or cones that may be flexed.

The disclosed methods herein can be valuable in the fabrication of electronic devices using a metallic glass-containing part. An electronic device herein can refer to any electronic device known in the art. For example, it can be a telephone, such as a mobile phone, and a land-line phone, or any communication device, such as a smart phone, including, for example an iPhone®, and an electronic email sending/receiving device. It can be a part of a display, such as a digital display, a TV monitor, an electronic-book reader, a portable web-browser (e.g., iPad®), and a computer monitor. It can also be an entertainment device, including a portable DVD player, conventional DVD player, Blue-Ray disk player, video game console, music player, such as a portable music player (e.g., iPod®), or wearable device (e.g., AppleWatch®), etc. It can also be a part of a device that provides control, such as controlling the streaming of images, videos, sounds (e.g., Apple TV®), or it can be a remote control for an electronic device. It can be a part of a computer or its accessories, such as the hard drive tower housing or casing, laptop housing, laptop keyboard, laptop track pad, desktop keyboard, mouse, and speaker. The article can also be applied to a device such as a watch or a clock.

Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A multilayer composite comprising:
   a plurality of metallic glass layers interleaved with a plurality of polymer layers,
   wherein the composite has a thickness of up to 100 microns, and
   wherein the composite has a fatigue strength of at least 1.5 times of the fatigue strength of a monolithic metallic glass having the same thickness as the composite and the same chemical composition as the metallic glass layer, and wherein the composite is free of plastic deformation after 180 degree folding test after 10,000 cycles.

2. The composite of claim 1, wherein each of the plurality of metallic glass layers and the plurality of polymer layers has a thickness up to 50 microns.

3. The composite of claim 1, wherein each of the plurality of polymer layers is thinner than the metallic glass layer.

4. The composite of claim 1, wherein each of the plurality of polymer layers has the same thickness as each of the plurality of metallic glass layers.

5. The composite of claim 1, wherein each of the plurality of polymer layers has a thickness of at least 10% of the thickness of each of the plurality of metallic glass layers.

6. The composite of claim 1, wherein each of the plurality of polymer layers comprises a material selected from the group consisting of polyimide, cycle-olefin polymer (COP), and acrylic polymer.

7. The composite of claim 1, wherein each of the plurality of metallic glass layers comprises a material selected from the group consisting of Zr-based, Ni-based, Fe-based, Cu-based, Al-based, Pt-based, Pd-based, Au-based, Ag-based, Co-based, Mg-based, and Ti-based metallic glass.

8. The composite of claim 1, wherein the composite has a volume ratio of a polymer comprising the plurality of polymer layers to a metallic glass comprising the plurality of metallic glass layers of at least 0.1.

9. The composite of claim 1, wherein each of the plurality of polymer layers has a Young's modulus of at least 10 times smaller than that of each of the plurality of metallic glass layers.

10. A method of forming the multilayer composite of claim 1, the method comprising:
    depositing a first polymer layer over an adhesive substrate;
    depositing a first metallic glass layer over the first polymer layer;
    depositing a second polymer layer over the first metallic glass layer; and
    depositing a second metallic glass layer over the second polymer layer,
    to form the plurality of metallic glass layers interleved with the plurality of polymer layers.

11. The method of claim 10, the step of depositing the first or the second metallic glass layer comprises physical vapor deposition or sputtering.

12. The method of claim 10, the step of depositing the first or the second polymer layer comprises chemical vapor deposition.

13. The method of claim 10, wherein the first or the second metallic glass layer comprises a material selected from the group consisting of Zr-based, Ni-based, Fe-based, Cu-based, Al-based, Pt-based, Pd-based, Au-based, Ag-based, Co-based, Mg-based, and Ti-based metallic glass.

14. The method of claim 10, wherein the composite has a volume ratio of a polymer comprising the first polymer layer and the second polymer layer to a metallic glass comprising the first metallic glass layer and the second metallic glass layer of at least 0.1.

15. The method of claim 10, wherein each of the first polymer layer and the second polymer layer has a thickness of at least 10% of the thickness of each of the first metallic glass layer and the second metallic glass layer.

16. The method of claim 10, wherein each of the first metallic glass layer and the second metallic glass layer and each of the first polymer layer and the second polymer layer has a thickness of up to 50 microns.

* * * * *